United States Patent
Rehani et al.

(10) Patent No.: US 11,381,164 B1
(45) Date of Patent: Jul. 5, 2022

(54) PRE-CHARGE TECHNIQUE FOR IMPROVED CHARGE PUMP EFFICIENCY

(71) Applicant: SANDISK TECHNOLOGIES LLC, Addison, TX (US)

(72) Inventors: Ankit Rehani, Bangalore (IN); V S N K Chaitanya G, Bangalore (IN); Venkata Nittala, Bangalore (IN); Pradeep Anantula, Bangalore (IN)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 17/206,860

(22) Filed: Mar. 19, 2021

(51) Int. Cl.
*H02M 3/07* (2006.01)
*G11C 5/14* (2006.01)

(52) U.S. Cl.
CPC ............. *H02M 3/073* (2013.01); *G11C 5/145* (2013.01); *H02M 3/075* (2021.05)

(58) Field of Classification Search
None
See application file for complete search history.

(56) References Cited

U.S. PATENT DOCUMENTS

| | | | | |
|---|---|---|---|---|
| 5,038,325 A * | 8/1991 | Douglas | ................ | H02M 3/07 365/189.06 |
| 5,524,095 A * | 6/1996 | Someya | ................ | G11C 8/08 365/189.09 |
| 5,636,115 A * | 6/1997 | Drouot | ................ | G11C 5/145 307/110 |
| 5,940,333 A * | 8/1999 | Chung | ................ | G11C 16/30 365/189.09 |
| 8,963,624 B2 * | 2/2015 | Murakami | ............ | H02M 3/073 327/536 |
| 2010/0127761 A1 * | 5/2010 | Matano | ................ | H02M 3/07 327/536 |

* cited by examiner

*Primary Examiner* — Thomas J. Hiltunen
(74) *Attorney, Agent, or Firm* — Morgan, Lewis & Bockius LLC

(57) ABSTRACT

A charge pump includes first and second multiplier stages including first and second capacitor in series with an input node, a final multiplier stage including an output capacitor in series with the second capacitor and an output node, and pre-charge circuitry. The pre-charge circuitry is configured to charge the output capacitor to a first level during an initial phase of a charging operation, wherein the first level is equal to a supply voltage of the data storage system, and decouple a charging path of the pre-charge circuitry from the output capacitor in response to the output capacitor being charged to the first level. The first and second multiplier stages are configured to increase the charge of the output capacitor to second and third levels higher than the first level during second and third phases of the charging operation.

20 Claims, 5 Drawing Sheets

PRE-CHARGE TECHNIQUE FOR IMPROVED CHARGE PUMP EFFICIENCY

TECHNICAL FIELD

The present disclosure relates to charge pumps in data storage systems.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity, in turn, stokes demand for greater performance (e.g., quicker reads and writes), so that the addition of storage capacity does not slow down the memory device. As such, there is ongoing pressure to increase the capacity and the efficiency of non-volatile memories in order to further improve the useful attributes of such devices.

SUMMARY

This application describes various systems and methods for improving the efficiency of a charge pump for an array of memory cells of a storage medium. Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description," one will understand how the features of various implementations are used to improve write performance.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
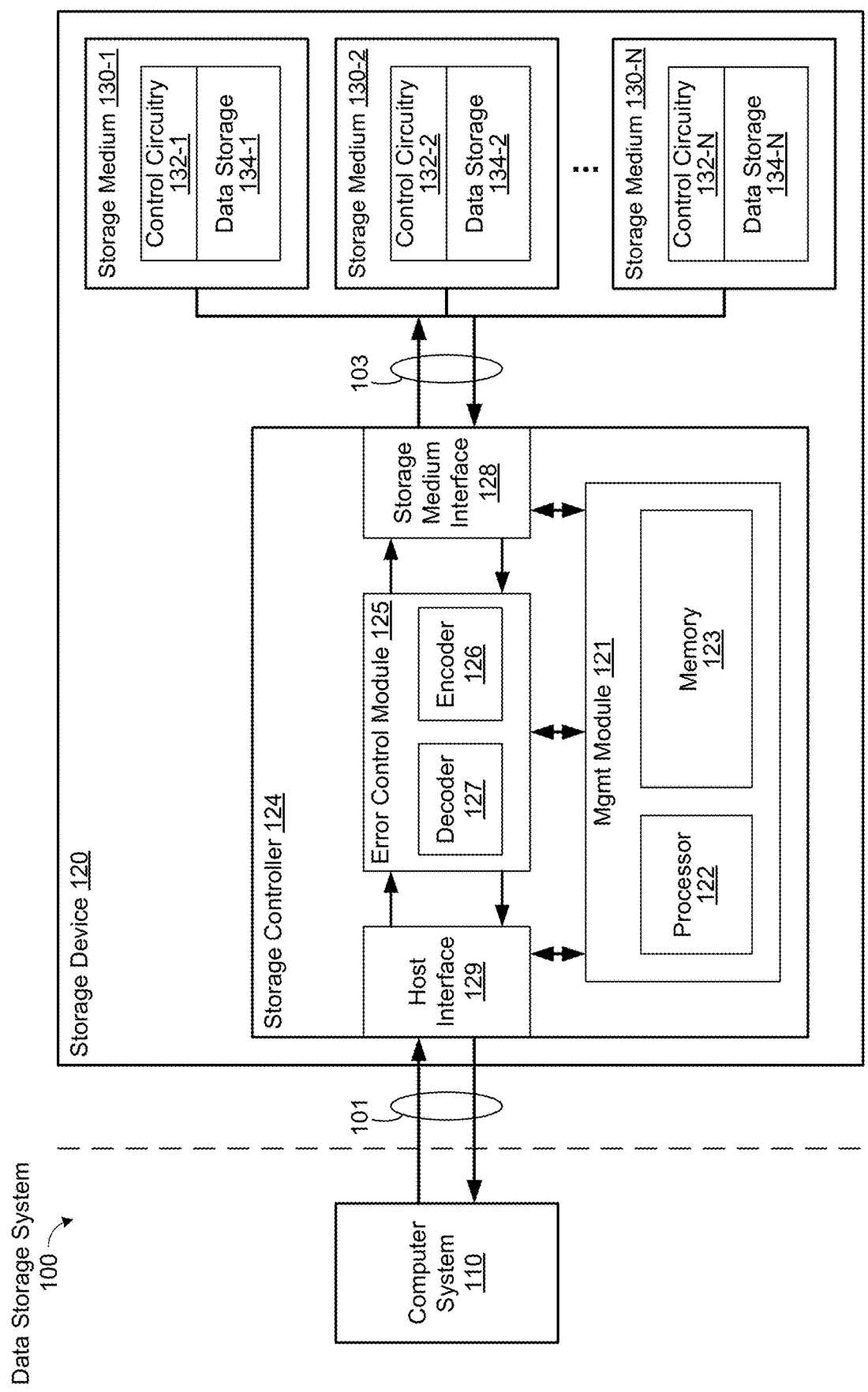
FIG. 1 is a block diagram of a data storage system in accordance with some implementations.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a diagram of an implementation of a data storage environment, namely data storage system 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, the data storage system 100 includes a data processing system (alternatively referred to herein as a computer system or host) 110, and a storage device 120.

The computer system 110 is coupled to the storage device 120 through data connections 101. In various implementations, the computer system 110 includes the storage device 120 as a component. Generally, the computer system 110 includes any suitable computer device, such as a computer, a laptop computer, a tablet device, a netbook, an internet kiosk, a personal digital assistant, a mobile phone, a smartphone, a gaming device, a computer server, a peripheral component interconnect (PCI), a serial AT attachment (SATA), or any other computing device. In some implementations, the computer system 110 includes one or more processors, one or more types of memory, a display, and/or other user interface components such as a keyboard, a touch screen display, a mouse, a trackpad, a digital camera, and/or any number of supplemental devices to add functionality.

The storage device 120 includes one or more storage mediums 130 (e.g., N storage mediums 130, where N is an integer greater than or equal to 1). The storage medium(s) 130 are coupled to a storage controller 124 through data connections of a channel 103. In various implementations, the storage controller 124 and storage medium(s) 130 are included in the same device (e.g., storage device 120) as constituent components thereof, while in other embodiments, the storage controller 124 and storage medium(s) 130 are, or are in, separate devices. In some embodiments, the storage controller 124 is an application-specific integrated circuit (ASIC). The storage medium(s) 130 are optionally referred to as the NAND.

Each storage medium 130 includes control circuitry 132 and data storage 134. The data storage 134 may comprise any number (i.e., one or more) of memory devices including, without limitation, non-volatile semiconductor memory devices, such as flash memory (also referred to as memory cells). Flash memory devices can be configured for enterprise storage suitable for applications such as cloud computing, and/or configured for relatively smaller-scale applications such as personal flash drives or hard-disk replacements for personal, laptop and tablet computers.

In some implementations, the storage controller 124 includes a management module 121, an error control module 125, a storage medium interface 128, and a host interface 129. In some implementations, the storage controller 124 includes various additional features that have not been illustrated for the sake of brevity, so as not to obscure more pertinent features of the example implementations disclosed herein. As such, a different arrangement of features may be possible.

The host interface 129 couples the storage device 120 and its storage controller 124 to one or more computer systems 110. The host interface 129 typically includes data buffers (not shown) to buffer data being received and transmitted by the storage device 120 via the data connections 101.

The storage medium interface 128 couples the storage controller 124 to the storage medium(s) 130. The storage medium interface 128 provides an interface to the storage medium(s) 130 though the data connections of the channel 103. In some implementations, the storage medium interface 128 includes read and write circuitry.

The error control module 125 is coupled between the storage medium interface 128 and the host interface 129. In some implementations, the error control module 125 is provided to limit the number of uncorrectable errors inadvertently introduced into data. To that end, the error control module 125 includes an encoder 126 and a decoder 127. The encoder 126 encodes data to produce a code word, which is subsequently stored in a storage medium 130. When the encoded data is read from the storage medium 130, the decoder 127 applies a decoding process to recover the data and correct errors within the error correcting capability of the error control code. Various error control codes have different error detection and correction capacities, and particular codes are selected for various applications.

The management module 121 typically includes one or more processors 122 (sometimes referred to herein as CPUs, processing units, hardware processors, processors, microprocessors or microcontrollers) for executing modules, programs and/or instructions stored in memory and thereby performing processing operations. However, in some implementations, the processor(s) 122 are shared by one or more components within, and in some cases, beyond the function of the storage controller 124. The management module 121 is coupled by communication buses to the host interface 129, the error control module 125, and the storage medium interface 128 in order to coordinate the operation of these components.

The management module 121 also includes memory 123 (sometimes referred to herein as controller memory), and one or more communication buses for interconnecting the memory 123 with the processor(s) 122. Communication buses optionally include circuitry (sometimes called a chipset) that interconnects and controls communications between system components. The controller memory 123 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. The controller memory 123 optionally includes one or more storage devices remotely located from the one or more processors 122. In some embodiments, the controller memory 123, or alternatively the non-volatile memory device(s) within the controller memory 123, comprises a non-transitory computer readable storage medium. In some embodiments, the controller memory 123, or the non-transitory computer readable storage medium of the controller memory 123, stores the programs, modules, and/or data structures, or a subset or superset thereof, for performing one or more of the operations described in this application with regard to any of the components associated with the storage controller 124.

In some embodiments, the various operations described in this application correspond to sets of instructions for performing the corresponding functions. These sets of instructions (i.e., modules or programs) need not be implemented as separate software programs, procedures or modules, and thus various subsets of these modules may be combined or otherwise rearranged in various embodiments. In some embodiments, the memory 123 may store a subset of modules and data structures. Furthermore, the memory 123 may store additional modules and data structures. In some embodiments, the programs, modules, and data structures stored in the memory 123, or the non-transitory computer readable storage medium of the memory 123, provide instructions for implementing any of the methods described below. Stated another way, the programs or modules stored in the memory 123, when executed by the one or more processors 122, cause the storage device 120 to perform any of the operations described below. Although FIG. 1 shows various modules, FIG. 1 is intended more as a functional description of the various features, which may be present in the modules than as a structural schematic of the embodiments described herein. In practice, the programs, modules, and data structures shown separately could be combined, and some programs, modules, and data structures could be separated.

Figure 2:
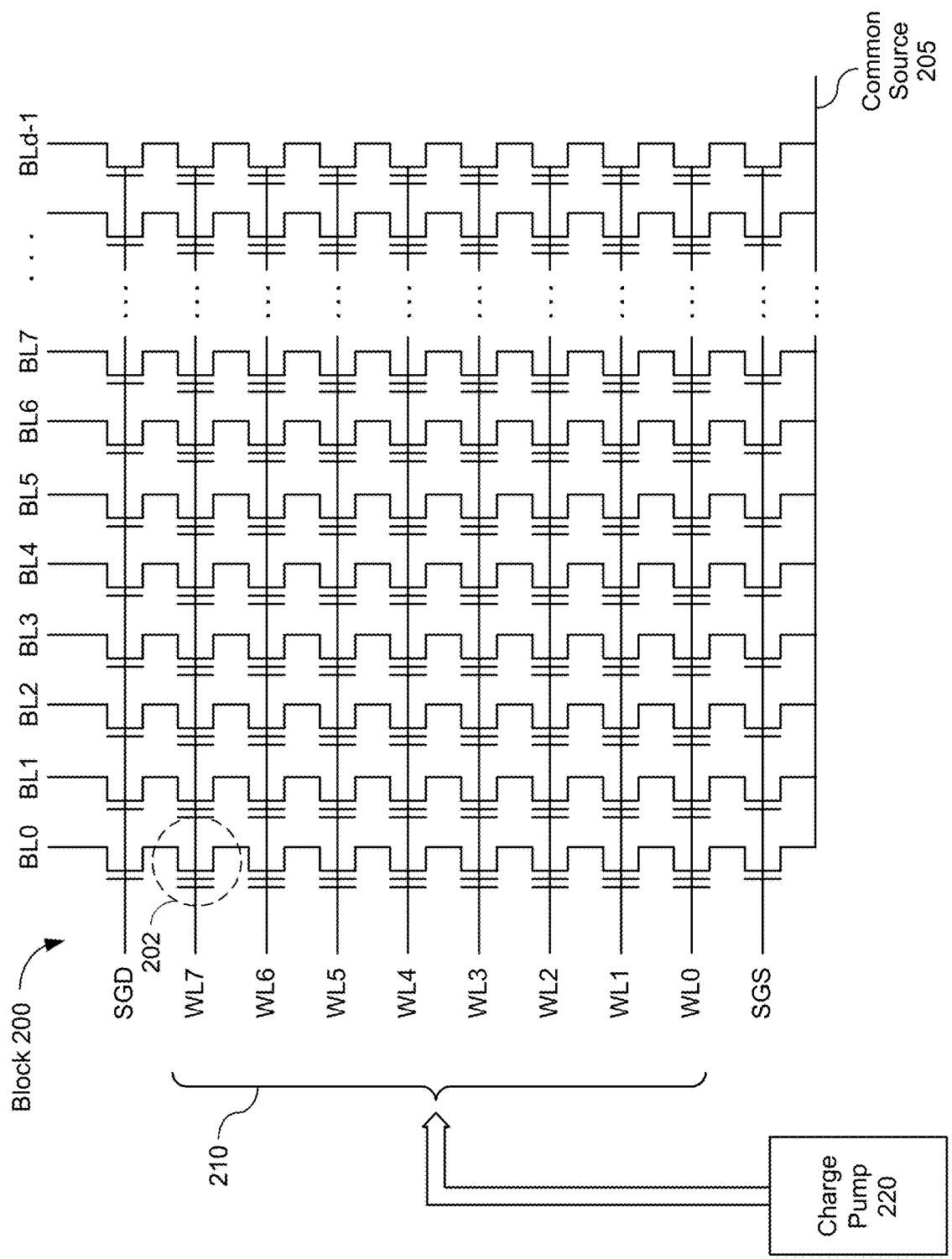
FIG. 2 is a block diagram of an array of memory cells and a charge pump in accordance with some implementations.

FIG. 2 depicts a block 200 of memory cells (e.g., 202) in a data storage 134 of a storage medium 130 (FIG. 1). The memory cells communicate with respective word lines WL0-WL7 (210), respective bit lines BL0-Bd-1, and a common source line 205. In the example provided, eight memory cells are connected in series to form a NAND string, and there are eight data word lines WL0 through WL7. One terminal of each NAND string is connected to a corresponding bit line via a drain select gate (connected to select gate drain line SGD), and another terminal is connected to a common source 205 via a source select gate (connected to select gate source line SGS). Thus, the common source 205 is coupled to each NAND string. The block 200 may be one of many such blocks in a memory array of data storage 134 (FIG. 1).

In an erase operation, a high voltage (e.g., 20 V) may be applied to a substrate on which the NAND string is formed to remove charge from the memory cells. During a programming operation, a voltage (e.g., in the range of 12-21 V) may be applied to a selected word line. In one approach, stepwise increasing program pulses are applied until a memory cell is verified to have reached an intended state. Moreover, pass voltages at a lower level may be applied concurrently to the unselected word lines. In read and verify operations, the select gates (SGD and SGS) may be connected to a voltage (e.g., in the range of 2.5 to 4.5 V) and the unselected word lines may be raised to a read pass voltage (e.g., in the range of 4.5 to 6 V) to make the transistors operate as pass gates. The selected word line is connected to a voltage, a level of which is specified for each read and verify operation, to determine whether a threshold voltage of the concerned memory cell is above or below such level.

The voltage levels described above may be higher than an available supply voltage of the storage device 120. To accommodate such voltage levels, a charge pump 220 may be used. The charge pump 220 may provide such voltages at different levels during erase, program, or read operations for the memory cells of the block 200. The output of the charge pump 220 may be used to provide different voltages concurrently to different word lines or groups of word lines. It is also possible to use multiple charge pumps 220 to supply different word line voltages. Similarly, the output from a charge pump can be provided to a bit line or other location as needed in the memory device.

Charge Pumps are important building blocks for memory devices as described herein. As noted above, they may be used for providing appropriate bias voltage levels for performing erase, program, and read operations. Charge pumps may convert a fixed input voltage to a higher output voltage as per the biasing requirements. Most of the power consumed by charge pumps employed to bias an array of memory cells may be during a ramp-phase. This is so because a charge pump typically needs to charge a very high capacitor from a reset voltage to a target voltage level. The charge pump 220, as described herein, improves efficiency such that power consumption can be reduced, directly affecting the overall current consumption of the media streaming device 210 during memory operations.

Figure 3:
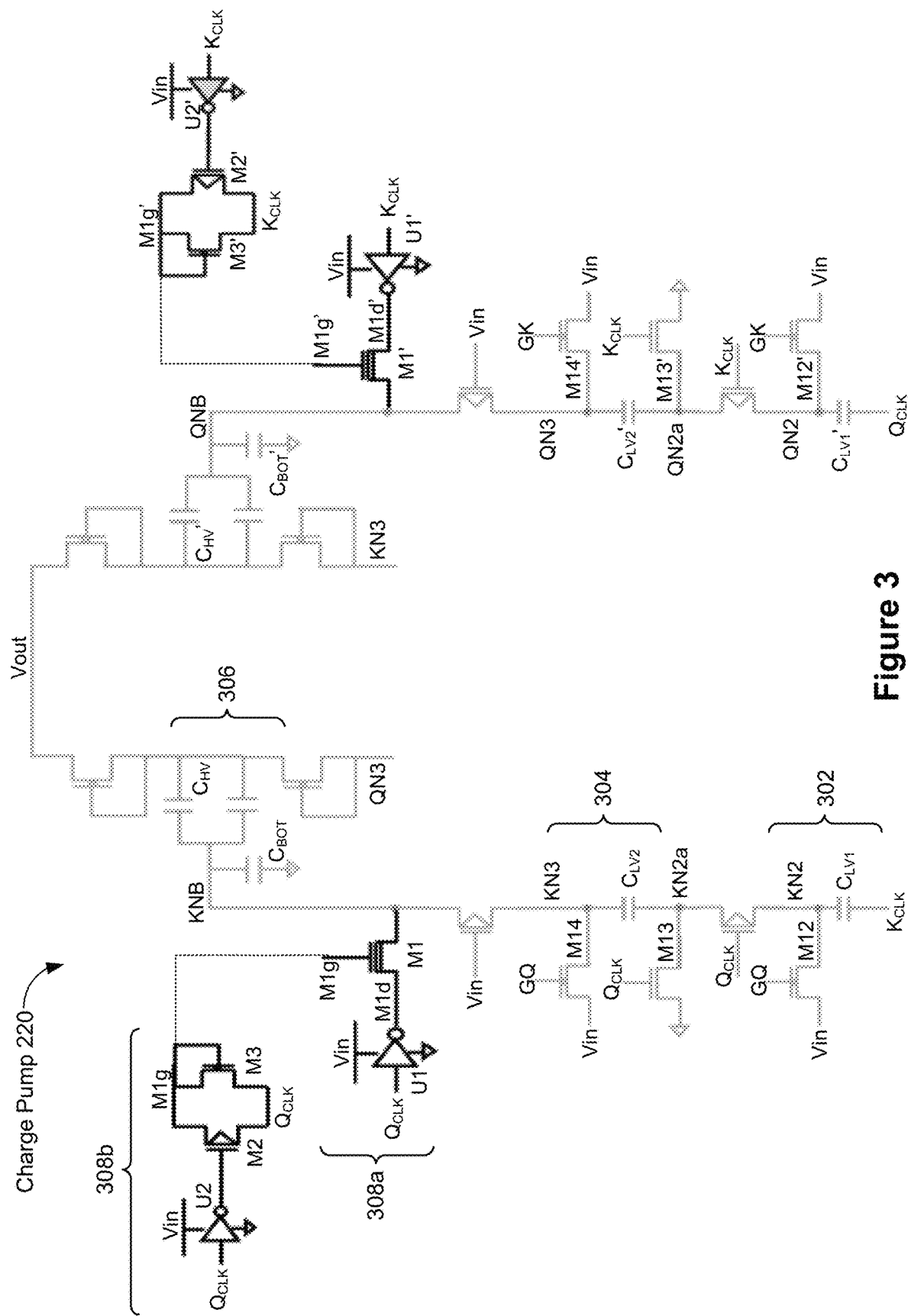
FIG. 3 is a circuit diagram of a charge pump in accordance with some implementations.

FIG. 3 is a circuit diagram of the charge pump 220 in accordance with some implementations. The charge pump 220 includes two subsets of voltage multiplying circuitry (depicted in the left half of the figure and the right half of the figure), with each subset operating in different clock phases. Each subset multiplies an input voltage Vin by alternately charging respective high voltage capacitors $C_{HV}$ and $C_{HV}'$ to provide a multiplied output voltage Vout. Since the circuitry in each subset behaves similarly (other than the phase difference of clocks $K_{CLK}$ and $Q_{CLK}$), the following description is with respect to the subset depicted in the left half of the figure. The same functionality (accounting for the difference in clock phases) applies to the subset depicted in the right half of the figure. Features shared between each subset are similarly labeled, and some are not further discussed for purposes of brevity, and so as not to obscure more pertinent aspects of the example implementations disclosed herein.

The voltage multiplying circuitry of charge pump 220 includes a plurality of stages, such as a first stage 302, a second stage 304, and a third stage 306. The first and second stages may be referred to as low voltage stages, and the third stage may be referred to as a high voltage stage. While the figure depicts three stages, more stages may be implemented without departing from the concepts described herein. The first stage 302 includes a first low voltage capacitor $C_{LV1}$, the second stage includes a second low voltage capacitor $C_{LV2}$, and the third stage includes a high voltage capacitor $C_{HV}$.

Each capacitor may be charged to a first voltage level during a first phase (charge phase), and then charged to a higher voltage level during a subsequent phase (kick phase). During the charge phase, a given capacitor is connected across a voltage supply (e.g., Vin), charging it to that same voltage. During the kick phase, the circuitry around the capacitor is reconfigured so that the capacitor is in series with the supply and an output node. This doubles the voltage at the output node (e.g., to 2*Vin, the sum of the original voltage supply and the capacitor voltage).

For example, when charging $C_{LV1}$, $K_{CLK}$ may be grounded and transistor M12 may connect node KN2 to voltage supply Vin, thereby charging $C_{LV1}$ from 0 to Vin. When $K_{CLK}$ goes high in the next clock phase, voltage supply Vin is disconnected by transistor M12 and $C_{LV1}$ gets kicked (the capacitor is charged to a higher level through its bottom plate) by the $K_{CLK}$ signal. If the $K_{CLK}$ signal is equal to Vin, then node KN2 nodes increases from Vin to 2*Vin. In general, once a capacitor at a given stage is initially charged, and then its bottom plate is kicked, the voltage at the node at the top plate of the capacitor may increase to a higher level than is available at the storage device 120.

The capacitor at a given stage may be kicked by voltage supplied by the preceding stage. The charge may keep building to the last stage in order to realize the final voltage Vout. However, by multiplying the voltage stage by stage in such a manner, an increasing amount of supply current may be lost, which may lead to significant drops in efficiency. For example, the high value capacitor $C_{HV}$ in the final stage 306 realizes a desired output voltage Vout when its bottom plate (represented by $C_{BOT}$) is kicked by voltage present at node KNB. Depending on where this voltage comes from (e.g., if it is serially charged by each proceeding stage), different amounts of current required to charge $C_{BOT}$ may be lost since the charge is never transferred to the output.

Accordingly, the charge pump 220, as described in detail below, implements an improved technique for kicking the bottom plate of the capacitor in the final stage 306. This improved technique kicks the bottom plate of the final stage capacitor in a plurality of steps, optimizing the voltage source for each step such that power losses are minimized. Specifically, the technique described below with reference to FIGS. 3-5 minimizes the charge taken from the least efficient supply at node KN3, thereby improving efficiency. Instead of charging $C_{BOT}$ directly from 0 to 3*Vin using the voltage available at node KN3 (the least efficient supply), the technique described herein charges $C_{BOT}$ (i) from 0 to Vin directly from the Vin supply (the most efficient supply), (ii) from Vin to 2*Vin from the voltage available at node KN2 (a moderately efficient supply), and (iii) from 2*Vin to 3*Vin from the voltage available at node KN3 (the least efficient supply). These three steps correspond to operations 502, 504, and 506, respectively, of method 500 in FIG. 5 (described in more detail below).

Referring back to FIG. 3, circuitry 308a and 308b implement the first step (operation 502). Circuitry 308a charges $C_{BOT}$ from 0 to Vin by feeding the supply voltage Vin to node KNB during the pre-charging phase (operation 502), and then cuts itself off from the rest of the charge pump circuitry once pre-charging is completed, as described in more detail below.

Circuitry 308a includes an inverter U1 in series with clock signal $Q_{CLK}$ and the drain of transistor M1. Transistor M1 may be an NMOS having a negative threshold voltage. As such, transistor M1 is on/conducting when the gate voltage with respect to the source is 0V (since 0V is higher than the negative threshold voltage). The drain of transistor M1 is connected to the inverter U1 (depicted as node M1d), and the source of transistor M1 is connected to node KNB. The gate of transistor M1 is controlled by gate control signal M1g, which is controlled by circuitry 308b.

Circuitry 308b includes an inverter U2 in series with clock signal $Q_{CLK}$ and two parallel transistors M2 and M3. Transistor M2 may be a PMOS. As such, transistor M2 conducts current between its source and drain when $Q_{CLK}$ is high and the output of inverter U2 is low. Transistor M3 may be a diode-connected NMOS. Since the gate and drain of transistor M3 are shorted, transistor M3 is automatically on/conducting until M1g discharges below a threshold voltage Vth of transistor M3. This ensures that after $C_{BOT}$ is pre-charged from 0 to Vin, there is no back current across transistor M1. Specifically, M1 turns off while charge is being delivered to $C_{BOT}$ by nodes KN2 and KN3, so charge is not delivered by M1 during those times.

Figure 4:
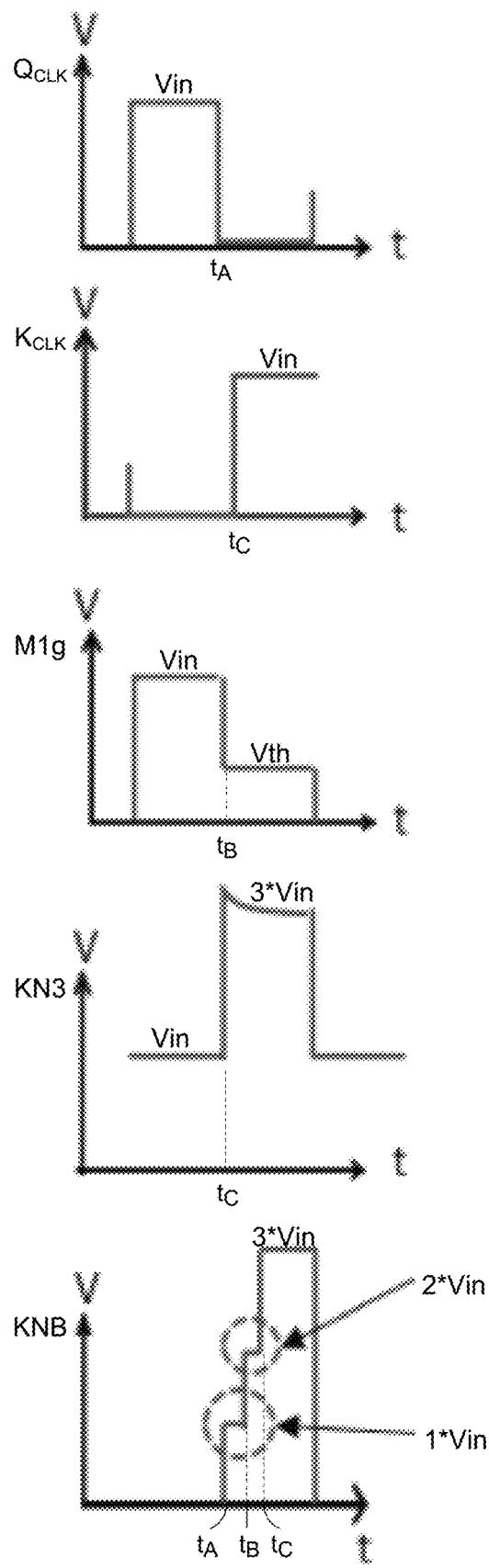
FIG. 4 depicts timing diagrams for a charge clock, a kick clock, a gate control node, an intermediate stage node, and a final stage node of the charge pump depicted in FIG. 3 in accordance with some implementations.

FIG. 4 depicts timing diagrams for charge clock $Q_{CLK}$, kick clock $K_{CLK}$, gate control M1g for transistor M1, node KN3, and node KNB of the charge pump 220 in accordance with some implementations. The charge clock $Q_{CLK}$ and kick clock $K_{CLK}$ signals are inverted, so that when one is higher (e.g., Vin), the other is low (e.g., 0), and vice versa. When the charge clock $Q_{CLK}$ is high, this may be referred to as a charge phase, and when the kick clock $K_{CLK}$ is high, this may be referred to as a kick phase. There is a nonzero amount of time between one clock signal going low and the other clock signal going high (e.g., between times $t_A$ and $t_C$). The gate control signal M1g is high while charge clock $Q_{CLK}$ is high, and then discharges to a threshold voltage that turns transistor M1 off while kick clock $K_{CLK}$ is high, in order to avoid contention while the low voltage stages ($C_{LV1}$ and $C_{LV2}$) are kicking node KN3 to 3*Vin. Node KNB (the node that kicks $C_{BOT}$) is pre-charged to Vin via the highly efficient storage device supply voltage (Vcc=Vin) at time $t_A$ (when $Q_{CLK}$ goes low) (operation 502), then charged to 2*Vin via the moderately efficient supply available at node KN2 at time $t_B$ (after $Q_{CLK}$ goes low and before $K_{CLK}$ goes high) (operation 504), and then charged to 3*Vin via the inefficient supply available at node KN3 at time $t_C$ (when $K_{CLK}$ goes high) (operation 506).

Figure 5:
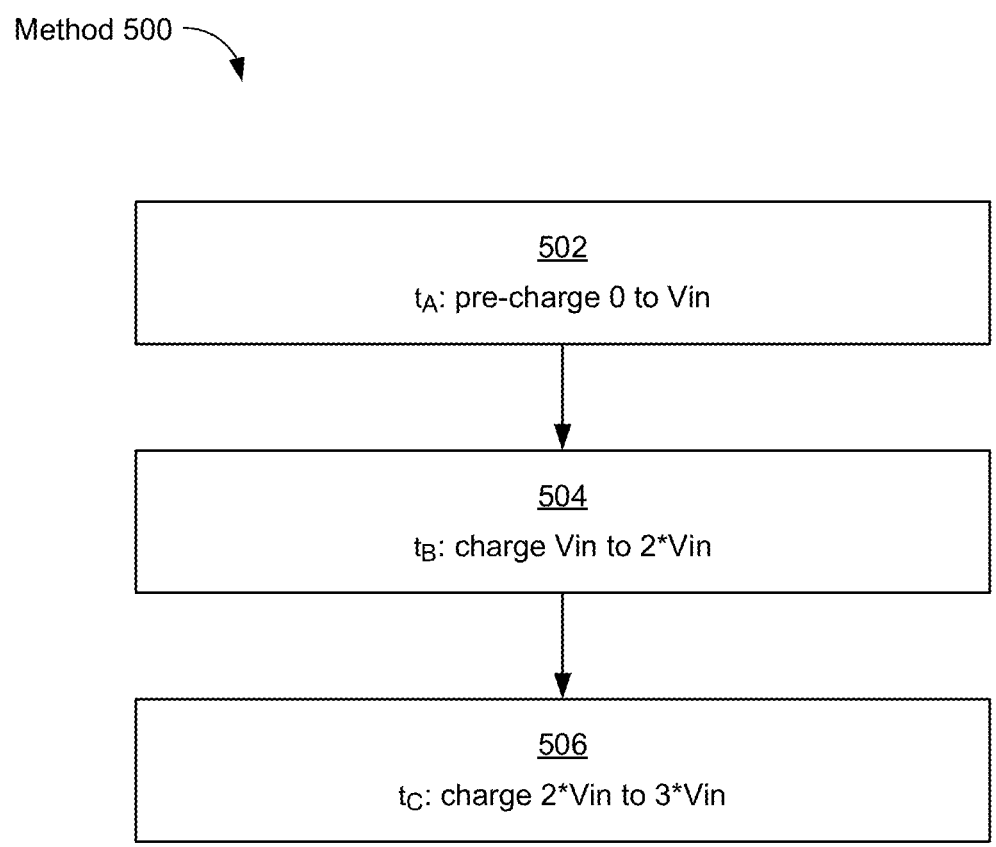
FIG. 5 is a flow diagram of a method for charging the charge pump depicted in FIG. 3 in accordance with some implementations.

FIG. 5 is a flow diagram of a method 500 for charging the charge pump 220 in accordance with some implementations. The method 500 charges the output node Vout to a multiple of the input supply voltage Vin. While the multiplier in this example is 6 (charging Vout to 6*Vin), other multipliers may be implemented without departing from the concepts described herein. For example, additional low voltage stages may be implemented (e.g., prior to stage 302), or fewer low voltage stages may be implemented (e.g., only stage 304). Proceeding with a voltage multiplier of 6, the method 500 charges $C_{HV}$ to 3*Vin and $C_{HV}'$ to 3*Vin. As such, these two voltages add up to 6*Vin at the Vout node. Since the left side and the right side of the charge pump 220 are mirrored (as described above), the following description is with reference to the charging of $C_{HV}$ (on the left side). Similar operations may be executed to charge $C_{HV}'$ for alternating clock cycles as described above.

To charge the $C_{HV}$ to 3*Vin, the charge pump 220 performs three distinct operations (or three distinct phases of a charging operation): (i) a pre-charge operation or phase 502 using the most efficient voltage supply available to the charge pump, (ii) an intermediate charging operation or phase 504, and (iii) a final charging operation or phase 506. These operations kick the bottom plate capacitor $C_{BOT}$ of the high voltage capacitor $C_{HV}$ in the final stage 306 (at node KNB) to 3*Vin while minimizing the amount of charge taken from the stage prior to the final stage (stage 304 at node KN3).

In the pre-charging operation 502, circuitry 308a charges $C_{BOT}$ from 0 to Vin. This is the most efficient charging operation since all of the supply current that is used by circuitry 308a to charge $C_{BOT}$ is passed to the output node Vout. In order to charge $C_{BOT}$, transistor M1 provides a path from Vin (provided by inverted $Q_{CLK}$ signal, see FIG. 4) to node KNB. Specifically, in the charge phase, $Q_{CLK}$ is high. Inverter U2 inverts $Q_{CLK}$ to logic low (approximately 0V) and provides the low signal to the gate of PMOS transistor M2, which turns on the transistor M2, thereby passing $Q_{CLK}$ to M1g. As a result, M1g is biased at Vin, which allows $C_{BOT}$ to be pre-charged to Vin by circuitry 308a at time $t_A$.

Specifically, when $Q_{CLK}$ goes low at the end of the charge phase (at time $t_A$), inverter U2 inverts the low signal to logic high (approximately Vin) and provides the high signal to the gate of PMOS transistor M2, which causes transistor M2 to turn off, which causes M1g to discharge from Vin to the threshold voltage (Vth) of transistor M3 (transistor M3 cuts off when M1g discharges to Vth, causing M1g to remain at Vth). Transistor M1 remains on because it is a negative threshold voltage device, as described above. The source of transistor M1 was grounded during the charge phase ($K_{CLK}$ was at 0). When $Q_{CLK}$ transitions to 0 at time $t_A$, inverter U1 causes the drain of transistor M1 (M1d) to go high. This causes transistor M1 to conduct current toward node KNB, causing $C_{BOT}$ to charge from 0 to Vin (see the KNB timing diagram in FIG. 4 at time $t_A$).

Importantly, transistor M1 turns off when node KNB reaches very close to Vin (specifically, when the difference between the gate voltage of M1 and Vin becomes less than the threshold voltage Vth of M1). The turning off of transistor M1 cuts off the pre-charging circuitry 308a/308b from the rest of the charge pump circuitry, thereby preventing current at node KNB from discharging through the pre-charging circuitry during subsequent operations.

In the next charging operation 504, $C_{BOT}$ is kicked from Vin to 2*Vin. First, when the pre-charging (operation 502) of $C_{BOT}$ from 0 to Vin is completed, node M1d (drain of transistor M1) allows $K_{CLK}$ to rise (at time $t_B$). More specifically, node M1d is coupled to digital control circuitry (not shown) that controls the timing of $K_{CLK}$. When pre-charging (operation 502) is complete, the voltage at node M1d signals to the digital control circuitry that it is time for the kick clock $K_{CLK}$ to rise. As such, the kick clock $K_{CLK}$ will not rise until the pre-charge operation is complete, allowing for transistor M1 to cut off the pre-charge circuitry 308a/308b before operations 504 and 506. Stated another way, circuitry 308a sends a digital signal using node M1d, which enables $K_{CLK}$ to go from 0 to 1 (see FIG. 4). As such, the kick clock $K_{CLK}$ may rise if and only if node M1d goes high (controlled by logic, not shown). Before $K_{CLK}$ rises (i.e., during the charge phase when $K_{CLK}$ is still low), the charge at node KN2 is equivalent to Vin. This charge (Vin) is passed to node KN2a after $Q_{CLK}$ has gone low, but before $K_{CLK}$ has gone high. As a result, $C_{LV2}$ has received a kick of Vin, which causes the voltage at node KN3 (and by extension, node KNB) to increase to 2*Vin. The increased voltage at node KNB kicks $C_{BOT}$ to 2*Vin.

In the final charging operation 506, $C_{BOT}$ is kicked from 2*Vin to 3*Vin. This is the least efficient charging operation due to the amount of supply current that is lost when charging from the kick clock $K_{CLK}$ signal. However, since this operation merely charges $C_{BOT}$ from 2*Vin to 3*Vin (rather than from 0 to 3*Vin), the amount of supply current that is lost may be minimized. The charge required for this operation is delivered when $K_{CLK}$ goes high (equivalent to Vin) at time $t_C$. As noted above, the kick $K_{CLK}$ may rise if and only if node M1d goes high. When kick clock $K_{CLK}$ goes high (equivalent to Vin), this causes the voltage at nodes KN2 and KN2a to increase from Vin to 2*Vin, and the voltage at nodes KN3 and KNB to increase from 2*Vin to 3*Vin.

As noted above, the kick provided to node KNB is done in three steps (operations 502, 504, and 506) which minimizes the charge taken from node KN3. Hence, supply current losses are reduced as charge is taken from input supply voltage Vin (~100% efficient supply) from 0 to Vin, and then from node KN2 (~45% efficient supply) from Vin to 2*Vin. Using this technique, charge taken from the least efficient supply, node KN3, is minimized. As a result, the charge pump 220 can more efficiently multiple the input voltage by a factor of 6 (the sum of 3*Vin at node KNB and 3*Vin at node QNB).

The foregoing description has been described with reference to specific implementations. However, the illustrative discussions above are not intended to be exhaustive or to limit the claims to the precise forms disclosed. Many variations are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

As used herein: the singular forms "a", "an," and "the" include the plural forms as well, unless the context clearly indicates otherwise; the term "and/or" encompasses all possible combinations of one or more of the associated listed items; the terms "first," "second," etc. are only used to distinguish one element from another and do not limit the elements themselves; the term "if" may be construed to mean "when," "upon," "in response to," or "in accordance with," depending on the context; and the terms "include," "including," "comprise," and "comprising" specify particular features or operations but do not preclude additional features or operations.

What is claimed is:

1. A charge pump for a data storage system, comprising:
   a first multiplier stage including a first capacitor in series with an input node of the charge pump;
   a second multiplier stage including a second capacitor in series with the first capacitor;
   a final multiplier stage including an output capacitor in series with the second capacitor and an output node of the charge pump;
   a charge clock and a kick clock inverted with respect to each other; and
   pre-charge circuitry configured to:
      charge the output capacitor to a first level during an initial phase of a charging operation, wherein the first level is equal to a supply voltage of the data storage system; and
      decouple a charging path of the pre-charge circuitry from the output capacitor in response to the output capacitor being charged to the first level;
   wherein the first and second multiplier stages are configured to:
      increase the charge of the output capacitor to a second level higher than the first level during a second phase of the charging operation using the supply voltage of the data storage system and the second capacitor, wherein the second phase of the charging operation is configured to execute subsequent to the charge clock transitioning low and prior to the kick clock transitioning high; and
      increase the charge of the output capacitor to a third level higher than the second level during a third phase of the charging operation using the supply voltage of the data storage system and the first and second capacitors.

2. The charge pump of claim 1, wherein:
   the initial phase of the charging operation is configured to execute while the charge clock is high;
   and
   the third phase of the charging operation is configured to execute upon the kick clock transitioning high.

3. The charge pump of claim 2, wherein the pre-charge circuitry is configured to signal the kick clock to transition high in response to voltage at the output capacitor reaching the first level or a threshold below the first level.

4. The charge pump of claim 1, wherein:
   the second level is equal to two times the first level;
   the third level is equal to three times the first level;
   each phase of the charging operation is configured to increase the charge of the output capacitor by an amount of voltage equal to the first level; and
   the initial phase of the charging operation consumes less power than the second and third phases of the charging operation.

5. The charge pump of claim 1, wherein the first and second multiplier stages are configured to forgo charging the output capacitor while the pre-charge circuitry is charging the output capacitor.

6. The charge pump of claim 1, wherein the output node of the charge pump is coupled to a plurality of word lines of the data storage system.

7. The charge pump of claim 1, wherein the input node is configured to provide the supply voltage of the data storage system and the output node is configured to provide an output voltage based on the third level of charge at the output capacitor.

8. A method of operating a charge pump for a data storage system, the charge pump including a first multiplier stage including a first capacitor in series with an input node of the charge pump, a second multiplier stage including a second capacitor in series with the first capacitor, a final multiplier stage including an output capacitor in series with the second capacitor and an output node of the charge pump; a charge clock and a kick clock inverted with respect to each other; and pre-charge circuitry; the method comprising:
   at the pre-charge circuitry:
      charging the output capacitor to a first level during an initial phase of a charging operation, wherein the first level is equal to a supply voltage of the data storage system; and
      decoupling a charging path of the pre-charge circuitry from the output capacitor in response to the output capacitor being charged to the first level; and
   at the first and second multiplier stages:
      increasing the charge of the output capacitor to a second level higher than the first level during a second phase of the charging operation using the supply voltage of the data storage system and the second capacitor, wherein the second phase of the charging operation is configured to execute subsequent to the charge clock transitioning low and prior to the kick clock transitioning high; and
      increasing the charge of the output capacitor to a third level higher than the second level during a third phase of the charging operation using the supply voltage of the data storage system and the first and second capacitors.

9. The method of claim 8, further comprising:
   executing the initial phase of the charging operation while the charge clock is high;
   and
   executing the third phase of the charging operation upon the kick clock transitioning high.

10. The method of claim 9, further comprising signaling, at the pre-charge circuitry, the kick clock to transition high in response to voltage at the output capacitor reaching the first level or a threshold below the first level.

11. The method of claim 8, wherein:
    the second level is equal to two times the first level;
    the third level is equal to three times the first level; and
    each phase of the charging operation increases the charge of the output capacitor by an amount of voltage equal to the first level; and
    the initial phase of the charging operation consumes less power than the second and third phases of the charging operation.

12. The method of claim 8, further comprising, at the first and second multiplier stages, forgoing charging the output capacitor while the pre-charge circuitry is charging the output capacitor.

13. The method of claim 8, wherein the output node of the charge pump is coupled to a plurality of word lines of the data storage system.

14. The method of claim 8, further comprising:
providing, at the input node, the supply voltage of the data storage system; and
providing, at the output node, an output voltage based on the third level of charge at the output capacitor.

15. A charge pump for a data storage system, comprising:
a first multiplier stage including a first capacitor in series with an input node of the charge pump;
a second multiplier stage including a second capacitor in series with the first capacitor;
a final multiplier stage including an output capacitor in series with the second capacitor and an output node of the charge pump;
a charge clock and a kick clock inverted with respect to each other; and
pre-charge circuitry including:
means for charging the output capacitor to a first level during an initial phase of a charging operation, wherein the first level is equal to a supply voltage of the data storage system; and
means for decoupling a charging path of the pre-charge circuitry from the output capacitor in response to the output capacitor being charged to the first level;
wherein the first and second multiplier stages include:
means for increasing the charge of the output capacitor to a second level higher than the first level during a second phase of the charging operation using the supply voltage of the data storage system and the second capacitor, wherein the second phase of the charging operation is configured to execute subsequent to the charge clock transitioning low and prior to the kick clock transitioning high; and
means for increasing the charge of the output capacitor to a third level higher than the second level during a third phase of the charging operation using the supply voltage of the data storage system and the first and second capacitors.

16. The charge pump of claim 15, wherein:
the initial phase of the charging operation is configured to execute while the charge clock is high; and
the third phase of the charging operation is configured to execute upon the kick clock transitioning high.

17. The charge pump of claim 16, wherein the pre-charge circuitry is configured to signal the kick clock to transition high in response to voltage at the output capacitor reaching the first level or a threshold below the first level.

18. The charge pump of claim 15, wherein:
the second level is equal to two times the first level;
the third level is equal to three times the first level;
each phase of the charging operation is configured to increase the charge of the output capacitor by an amount of voltage equal to the first level; and
the initial phase of the charging operation consumes less power than the second and third phases of the charging operation.

19. The charge pump of claim 15, wherein the first and second multiplier stages are configured to forgo charging the output capacitor while the pre-charge circuitry is charging the output capacitor.

20. The charge pump of claim 15, wherein the input node is configured to provide the supply voltage of the data storage system and the output node is configured to provide an output voltage based on the third level of charge at the output capacitor.

* * * * *